(12) United States Patent
Kawashima

(10) Patent No.: US 8,097,488 B2
(45) Date of Patent: Jan. 17, 2012

(54) METHOD FOR FORMING PATTERN, METHOD FOR MANUFACTURING SEMICONDUCTOR APPARATUS, AND METHOD FOR MANUFACTURING DISPLAY

(75) Inventor: Noriyuki Kawashima, Kanagawa (JP)

(73) Assignee: Sony Corporation, Tokyo (JP)

( * ) Notice: Subject to any disclaimer, the term of this patent is extended or adjusted under 35 U.S.C. 154(b) by 199 days.

(21) Appl. No.: 12/465,249

(22) Filed: May 13, 2009

(65) Prior Publication Data

US 2009/0286361 A1 Nov. 19, 2009

(30) Foreign Application Priority Data

May 14, 2008 (JP) ................................. 2008-126820

(51) Int. Cl.
*H01L 51/40* (2006.01)

(52) U.S. Cl. .................. 438/99; 438/151; 257/E51.006; 257/E21.411

(58) Field of Classification Search .................... 257/40, 257/52, 57, 59, 66, 72, E51.001–E51.052; 438/99, 149, 151–166
See application file for complete search history.

(56) References Cited

U.S. PATENT DOCUMENTS

| 2005/0071969 | A1 | 4/2005 | Sirringhaus et al. |
| 2005/0194588 | A1* | 9/2005 | Sasaki et al. ..................... 257/40 |
| 2006/0263576 | A1* | 11/2006 | Hirose .......................... 428/149 |
| 2007/0160762 | A1* | 7/2007 | Chaug et al. .................. 427/256 |
| 2007/0295965 | A1* | 12/2007 | Chae et al. ...................... 257/66 |
| 2008/0067506 | A1* | 3/2008 | Takei et al. ..................... 257/40 |
| 2009/0001361 | A1* | 1/2009 | Shiba et al. ..................... 257/40 |

FOREIGN PATENT DOCUMENTS

| JP | 2000-353594 | 12/2000 |
| JP | 2004-517737 | 6/2004 |
| JP | 2006-060079 | 3/2006 |
| JP | 2006-086128 | 3/2006 |
| JP | 2007-095379 | 4/2007 |
| JP | 2007-200905 | 8/2007 |

* cited by examiner

*Primary Examiner* — Matthew W Such
(74) *Attorney, Agent, or Firm* — SNR Denton US LLP

(57) ABSTRACT

A method for forming a pattern includes the steps of forming a resin pattern through printing on a substrate, forming a water-repellent pattern in such a way that an opening bottom of the resin pattern is covered with a fluorine based material by feeding the fluorine based material from the top of the resin pattern, forming an open window in the water-repellent pattern by removing the resin pattern, and forming a desired pattern composed of a pattern-forming material by feeding the pattern-forming material into the open window of the water-repellent pattern.

7 Claims, 5 Drawing Sheets

SEMICONDUCTOR LAYER
(TIPS PENTACEN)

METHOD FOR FORMING PATTERN, METHOD FOR MANUFACTURING SEMICONDUCTOR APPARATUS, AND METHOD FOR MANUFACTURING DISPLAY

BACKGROUND OF THE INVENTION

1. Field of the Invention

The present invention relates to a method for forming a pattern, a method for manufacturing a semiconductor apparatus, and a method for manufacturing a display.

2. Description of the Related Art

An organic thin film transistor (TFT) can be formed at low temperatures as compared with an amorphous silicon TFT in the related art and, therefore, application to a flexible display including a plastic substrate is expected. Furthermore, a substrate can be produced by an inexpensive process, e.g., coating, printing, or the like, by using a coating material soluble in a solvent without using a vacuum process nor photolithography. Therefore, cost reduction is expected.

Incidentally, regarding patterning of an organic material layer by application of an ink-jet method, many methods have been proposed, in which a barrier (bank) is formed from a water-repellent material through patterning in advance and, thereby, wetting and spreading of droplets, in which an organic material is dissolved, is prevented by the barrier so as to obtain an organic material layer in a desired shape (for example, Japanese Unexamined Patent Application Publication No. 2000-353594, Japanese Unexamined Patent Application Publication No. 2006-86128, Japanese Unexamined Patent Application Publication No. 2007-95379, and Japanese Unexamined Patent Application Publication No. 2007-200905).

In particular, regarding patterning of the organic semiconductor layer, a method in which organic semiconductor droplets are applied to fine grooves embossed has been proposed (refer to Japanese Unexamined Patent Application Publication (Translation of PCT Application) No. 2004-517737). Besides this, a method in which a difference is provided between the surface energy of a source electrode and a drain electrode serving as a substrate for forming an organic semiconductor layer and the surface energy of an insulating film and, thereby, a pattern is formed by applying a semiconductor solution to the insulating film between the source electrode and the drain electrode has been proposed (refer to Japanese Unexamined Patent Application Publication No. 2006-60079).

SUMMARY OF THE INVENTION

However, in the method in which the water-repellent barrier is patterned in advance, a photolithography process or a vacuum process, e.g., a fluorine plasma treatment, is used. Therefore, this method does not conform to the direction of the organic thin film transistor (TFT) in which a substrate can be produced by an inexpensive process, e.g., a process independent of vacuum or a process independent of photolithography. Furthermore, in the case where the water-repellent barrier is formed through printing, it is difficult to ensure the accuracy of shape of the printing pattern because the barrier is water repellant. Consequently, it is difficult to ensure the accuracy of pattern shape of a semiconductor layer formed by patterning while wetting and spreading are prevented by such a barrier.

Moreover, regarding the method in which embossing is conducted, it is feared that an electrode serving as a substrate and an insulating film are damaged easily during embossing and this method is not suitable for formation of a substrate having a large area. Even in the method in which the difference between the surface energy of the source electrode and the drain electrode and the surface energy of the insulating film is used, there are large variations in the film formation state of the organic semiconductor layer and, therefore, this method is not suitable for formation of a fine pattern of a high-definition display backplane or the like.

Accordingly, it is desirable to provide a method for forming a pattern in which a desired pattern with good accuracy of shape can be formed merely by applying a coating printing method, as well as a method for manufacturing a semiconductor apparatus and a method for manufacturing a display, in which the above-described method for forming a pattern is applied.

According to an embodiment of the present invention, a method for forming a pattern includes the steps of forming a resin pattern through printing on a substrate, forming a water-repellent pattern in such a way that an opening bottom of the resin pattern is covered with a fluorine based material by feeding the fluorine based material from the top of the resin pattern, forming an open window in the water-repellent pattern by removing the resin pattern, and forming a desired pattern composed of a pattern-forming material by feeding the pattern-forming material into the open window of the water-repellent pattern.

In the above-described method for forming a pattern, the water-repellent pattern is formed by feeding the fluorine based material while the resin pattern serves as a barrier. Consequently, the water-repellent pattern with good accuracy of shape is formed by a printing or coating process while the spreading of the fluororesin material is prevented. Therefore, the desired pattern with good accuracy of shape is formed by feeding the pattern-forming material while the water-repellent pattern serves as a barrier, that is, by the printing or coating process, in the forming a desired pattern.

Furthermore, according to embodiments of the present invention, a method for manufacturing a semiconductor apparatus and a method for manufacturing a display are also provided, in which a semiconductor layer is patterned by applying the above-described method for forming a pattern.

As described above, according to an embodiment of the present invention, the water-repellent pattern serving as a barrier for forming a desired pattern is formed with good accuracy of shape by applying a coating printing method and, thereby, a desired pattern with good accuracy of shape can be formed merely by applying a coating printing method. Consequently, a semiconductor apparatus in which the desired pattern is formed as a semiconductor layer can be made finer and, furthermore, a display including this semiconductor apparatus can exhibit a higher degree of definition.

DESCRIPTION OF THE PREFERRED EMBODIMENTS

In the following description, first, an application of a method for forming a pattern according to an embodiment of the present invention to formation of a semiconductor layer in production process of a backplane of a display will be explained as a method for manufacturing a semiconductor apparatus. Next, a method for manufacturing a liquid crystal display including the resulting backplane will be explained as a method for manufacturing a display.

Method for Manufacturing Semiconductor Apparatus

Figure 1:
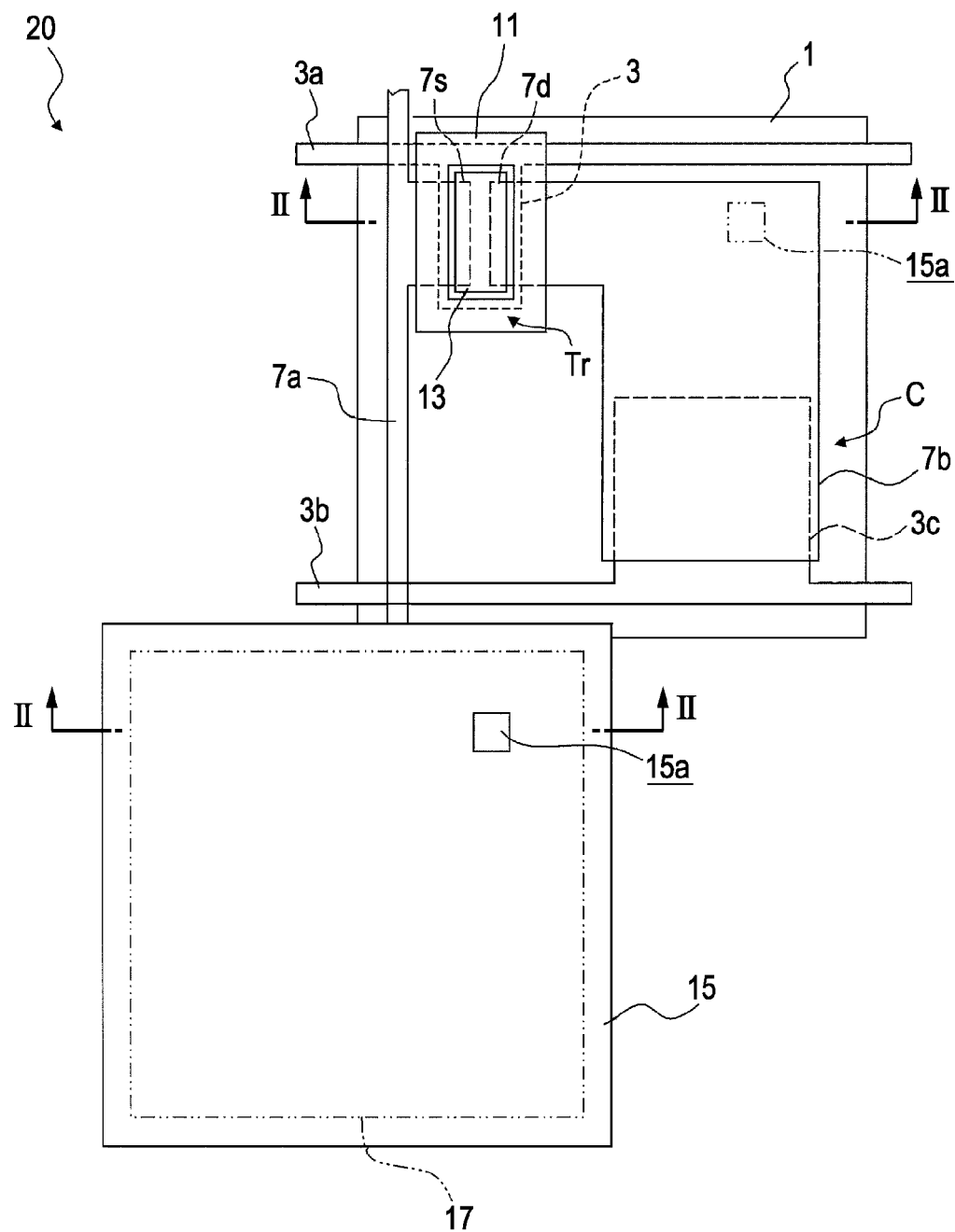
FIG. 1 is a plane configuration diagram of a backplane of a display produced as a semiconductor apparatus in an embodiment.

FIG. 1 shows a plane configuration of a backplane of a display produced as a semiconductor apparatus here. A formation procedure of a bottom gate structure (staggered type) organic thin film transistor, in which the method for forming a pattern according to an embodiment of the present invention is applied to patterning of an organic semiconductor layer, will be described below on the basis of sectional step diagrams, shown in FIGS. 2A to 2E, related to a II-II section shown in FIG. 1 with reference to FIG. 1.

Figure 2A:
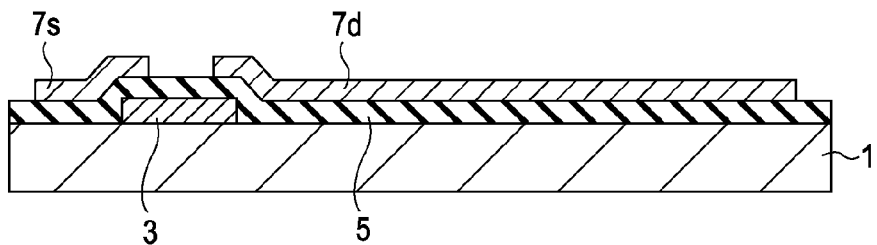
FIGS. 2A to 2E are diagrams for explaining a formation procedure of a bottom gate structure (staggered type) thin film transistor, in which the method for forming a pattern according to an embodiment of the present invention is applied to patterning of an organic semiconductor layer, in production of a backplane of a display, and are sectional step diagrams related to a II-II section shown in FIG. 1.

As shown in FIG. 2A, a gate electrode 3 is patterned on each pixel region of a substrate 1, and a gate insulating film 5 is formed covering the gate electrode 3. Thereafter, a source electrode 7s and a drain electrode 7d are patterned on the gate insulating film 5.

The gate electrode 3 is patterned as described below. An electrically conductive ink including silver fine particles is applied by, for example, a die coating method to the plastic substrate 1 formed from polyether sulfone (PES). Subsequently, a heat treatment is conducted at 150° C. and, thereby, an electrically conductive silver film having a film thickness of 50 nm is formed. A resist pattern in a desired shape is formed through screen printing of a resist ink on the electrically conductive film. The electrically conductive film is patterned through wet etching of the electrically conductive film using a silver etching solution while the resist pattern serves as a mask, so that the gate electrode 3 is formed. After the gate electrode 3 is formed, the resist ink is removed.

The substrate 1 is not limited to the plastic substrate and may be a glass substrate. The plastic substrate is not limited to a substrate formed from polyether sulfone (PES) and may be composed of polyethylene naphthalate (PEN), polyimide (PI), polycarbonate (PC), polyacrylate (PAR), polyether ether ketone (PEEK), polyphenylene sulfide (PPS), polyethylene terephthalate (PET), or the like. Furthermore, as for the substrate 1, a metal thin film substrate (metal foil) formed from stainless steel or the like may be used. The metal foil has low steam and oxygen permeability and may be used as a flexible substrate.

The gate electrode 3 is not limited to an electrode formed from silver. Metals, e.g., gold, platinum, palladium, copper, nickel, and aluminum, and electrically conductive organic materials including poly(3,4-ethylenedioxythiophene)/poly(4-styrenesulfonate) (PEDOT/PSS), polyaniline (PANI), and the like may also be used.

Furthermore, the resist pattern used as the mask in the wet etching of the electrically conductive film in the formation of the gate electrode 3 may be formed by using an ink-jet method, a photolithography method, or a laser drawing method. The gate electrode 3 may be formed through direct patterning by an ink-jet method, a screen printing method, a microcontact printing method, or an offset printing method. However, in order to ensure good insulating property of the gate insulating film 5 disposed covering the gate electrode 3, it is preferable that the surface of the gate electrode 3 is flat and the film thickness is minimum, for example, 100 nm or less.

As shown in FIG. 1, in the same step as that of formation of the above-described gate electrode 3, for example, a scanning line 3a connected to gate electrodes 3 of individual pixel regions arranged in a horizontal direction, a power supply line 3b disposed parallel to the scanning line 3a, and a lower electrode 3c of a capacity element disposed extending from the power supply line 3b are patterned.

The film formation of the gate insulating film 5 is conducted by, for example, a die coating method. Here, as an example, the gate insulating film 5 is formed by applying a 10 percent by weight solution of cross-linkable polymer material, polyvinylphenol (PVP), dissolved propylene glycol monomethyl ether acetate (PGMEA) to the substrate 1 provided with the gate electrode 3 and conducting a heat treatment at 180° C. for 1 hour. It is desirable that the film of this gate insulating film 5 is formed having a film thickness of 1 μm or less and a flat surface in order that a transistor is operated at low voltages.

As for the film formation of the gate insulating film 5, other coating methods, e.g., a gravure coating method, a roll coating method, a kiss coating method, a knife coating method, a slit coating method, a blade coating method, a spin coating method, and an ink-jet method, may be used besides the die coating method. As for the material for constituting the gate insulating film 5, polyimides, polyamides, polyesters, polyacrylates, polyvinyl alcohols, epoxy resins, novolac resins, and the like may be used besides PVP.

The source electrode 7s and the drain electrode 7d are disposed on the gate electrode 3 while being opposed to each other with the gate insulating film therebetween. Such source electrode 7s and drain electrode 7d are formed in a manner similar to that of the formation of, for example, the gate electrode 3. That is, a silver ink is applied uniformly by a die coating method and a heat treatment is conducted at 150° C. thereafter, so that an electrically conductive film having a film thickness of 50 nm is formed from silver. Subsequently, a pattern of a resist ink is formed on the electrically conductive film by a screen printing method. The electrically conductive film is wet-etched by using a silver etching solution while the resist pattern serves as a mask, so that the source electrode 7s and the drain electrode 7d are formed through patterning of the electrically conductive film. After the source electrode 7s and the drain electrode 7d are formed, the resist ink is removed.

In this regard, as for the source electrode 7s and the drain electrode 7d, metals, e.g., gold, platinum, palladium, copper, and nickel, which have good ohmic contact with a p-type semiconductor and electrically conductive organic materials including poly(3,4-ethylenedioxythiophene)/poly(4-styrenesulfonate) (PEDOT/PSS) and polyaniline (PANI) may also be used besides silver.

Furthermore, the resist pattern used as the mask in the wet etching of the electrically conductive film in the formation of the source electrode 7s and the drain electrode 7d may be formed by using an ink-jet method, a photolithography method, or a laser drawing method. Moreover, the source electrode 7s and the drain electrode 7d may be formed through direct patterning by an ink-jet method, a screen printing method, a microcontact printing method, or an offset printing method.

As shown in FIG. 1, in the same step as that of the above-described source electrode 7s and the drain electrode 7d, for example, a signal line 7a connected to source electrodes 7s of individual pixel regions arranged in a vertical direction and an upper electrode 7c of a capacity element disposed extending from the drain electrode 7d are patterned. In this manner, a capacity element C in which the gate insulating film is sandwiched between the lower electrode 3c and the upper electrode 7c is obtained.

The steps up to this point may be conducted in a manner similar to those in the related art. The steps described below have configurations specific to the present embodiment.

Figure 2B:
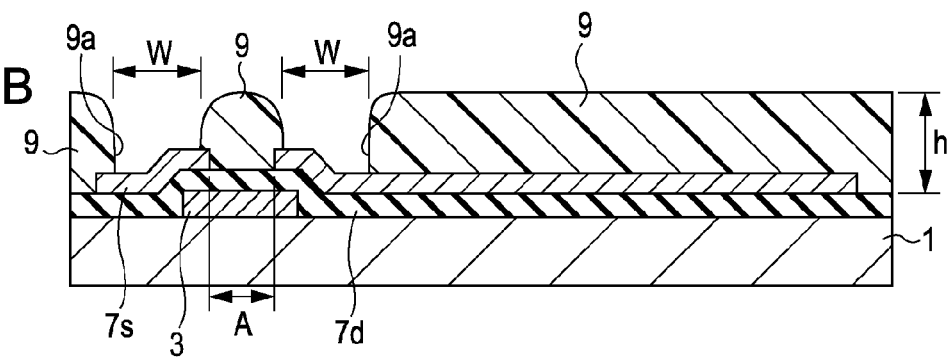

As shown in FIG. 2B, a resin pattern 9 having a desired shape is formed in advance above the substrate 1 provided with the source electrode 7s and the drain electrode 7d through printing by a screen printing method, an ink-jet method, a dispenser method, or a printing method, e.g., wax printing.

Here, a portion between the source electrode 7s and the drain electrode 7d on the gate electrode 3, that is, a portion A for forming a semiconductor layer formed as a desired pattern in the following step is covered with the resin pattern 9. The resin pattern 9 is provided with a ring-shaped opening 9a surrounding the above-described portion A for forming the semiconductor layer. It is preferable that the opening width W of the opening 9a is smaller insofar as the width is enough for absorbing at least a margin of positional accuracy of the semiconductor layer formed through printing between the source electrode 7s and the drain electrode 7d in the following steps. For example, the resin pattern 9 provided with a ring-shaped opening 9a, which has an opening width W=about 50 µm and which surrounds the portion A for forming the semiconductor layer, is formed here.

The patterning of the above-described resin pattern 9 is conducted through, for example, printing by using a resist ink, and the resin pattern 9 is formed through printing while the accuracy of shape is assigned the highest priority. Furthermore, it is preferable that the height h of the resin pattern formed through printing is enough for a water-repellent pattern to be cut stepwise into an upper portion on the resin pattern 9 and a lower portion in formation of the water-repellent pattern conducted thereafter. Therefore, the screen-printing method, in which a pattern having some extent of film thickness is easily formed through printing, is favorably applied to formation of the resin pattern 9 through printing. Preferably, this height h is about 0.5 µm to 10 µm and the height is specified to be about 2 µm here.

Figure 2C:
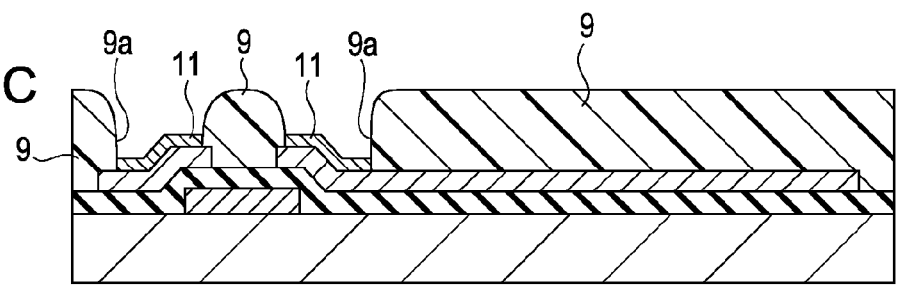

Subsequently, as shown in FIG. 2C, a fluorine based material is fed from the top of the resin pattern 9 and, thereby, a water-repellent pattern 11 covering the bottom potion of the opening 9a of the resin pattern 9 with the fluorine based material is formed. The fluorine based material may be any material insofar as the conditions of water repellency and adhesion to a substrate are satisfied. For example, fluororesins, e.g., CYTOP CTX-807A (trade name, produced by ASAHI GLASS CO., LTD.), Teflon AF (trade name, produced by DuPont), and OPTOOL (trade name, produced by Daikin Industries, Ltd.), may be used. For example, CYTOP CTX-807A is diluted to 0.1 percent by weight with a fluorine based solvent CT-SOLV180 (trade name, produced by ASAHI GLASS CO., LTD.) and is applied above the substrate 1 with a slit coater. The resulting substrate is fired at 100° C. for 1 hour. In this manner, the ring-shaped water-repellent pattern 11 (refer to FIG. 1) covering the bottom potion of the opening 9a of the resin pattern 9 with the fluorine based material is formed.

The fluorine based material is not necessarily a resin and may also be formed by applying a solution in which a silane coupling agent, e.g., fluoroalkylsilane, is dissolved.

The water-repellent pattern 11 formed by feeding the fluorine based material from the top of the resin pattern 9 is cut stepwise due to a large height difference of a side wall of the opening 9a of the resin pattern 9 and is patterned into the shape covering the bottom potion of the opening 9a of the resin pattern 9. At this time, fed and applied fluorine based material may remain on the top of the resin pattern 9 or no fluorine based material may remain. In either case, there is no serious problem.

It is preferable that the feeding of the above-described fluorine based material is conducted by the coating method because an improvement of the throughput is expected. However, the ink-jet method, in which the fluorine based material is fed to the opening 9a of the resin pattern 9, and the like may be applied. Furthermore, other printing methods may be applied.

Figure 2D:
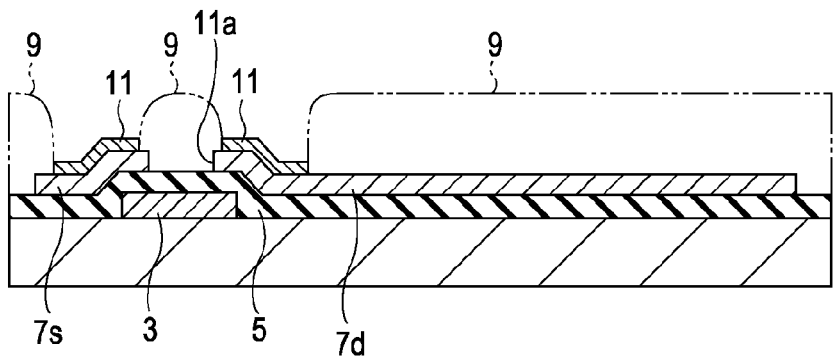

Next, as shown in FIG. 2D, the resin pattern 9 is removed. The removal of the resin pattern 9 is conducted through a cleaning treatment by using a N-methyl-2-pyrrolidone (NMP) solution. At this time, even if the water-repellent pattern 11 is not in the state of being subjected to a cross-linking reaction, the solubility in solvents other than fluorine based solvents is very small and, therefore, the water-repellent pattern 11 is not eliminated during this cleaning and removal step.

The resin pattern 9 is selectively removed as described above and, thereby, an open window 11a, from which the resin pattern 9 has been removed, is formed in a ring-shaped center portion of the water-repellent pattern 11. The gate insulating film 5 between the source electrode 7s and the drain electrode 7d and, furthermore, end portions of the source electrode 7s and the drain electrode 7d are exposed at the bottom portion of the open window 11a.

Figure 2E:
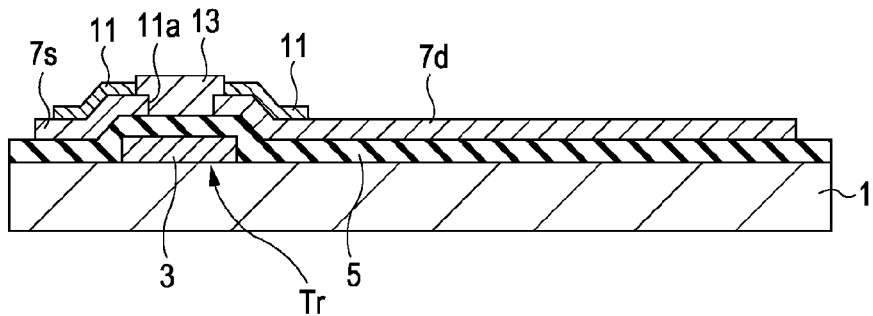

Thereafter, as shown in FIG. 2E, a semiconductor material serving as a pattern-forming material is fed into the open window 11a of the water-repellent pattern 11 and, thereby, a semiconductor layer 13, which is a desired pattern here, is patterned (refer to FIG. 1). The semiconductor material suitable for formation through coating is used here. For example, a solution in which 10 percent by weight of 6,13-bis(triisopropylsilylethynyl)pentacene (TIPS pentacene) is dissolved in xylene is applied to the inside of the open window 11a of the water-repellent pattern 11 by the ink-jet method. Subsequently, firing is conducted at 90° C. for 1 hour so as to form the semiconductor layer 13, which is the desired pattern, through printing.

At this time, even in the case where there is a few tens of micrometers of error in a discharge position of ink-jet to feed the semiconductor material relative to the water-repellent pattern 11 formed having a predetermined width W (=50 µm), the semiconductor material is repelled by the water-repellent pattern 11. Consequently, the semiconductor material is held in the open window 11a of the water-repellent pattern 11, and the semiconductor layer 13 in the shape of an island corresponding to the open window 11a is patterned. This semiconductor layer 13 is disposed in such a way as to come into contact with the gate insulating film 5 between the source electrode 7s and the drain electrode 7d and end portions of the source electrode 7s and the drain electrode 7d.

The semiconductor layer 13 is formed by using a semiconductor material suitable for formation through coating. Besides TIPS pentacene described above, polymer materials, e.g., polythiophenes, fluorene-thiophene copolymers, and polyallylamines, and low-molecular materials, e.g., pentacene derivatives suitable for formation through coating, rubrene derivatives, thiophene oligomers, naphthacene derivatives, and porphyrin compounds, may be used. The semiconductor layer 13 is not limited to the organic material, and coating type silicon based materials, oxide materials, and compound semiconductor materials may be used insofar as they are suitable for formation through coating.

In the case where portions other than the portion to be provided with the semiconductor layer 13 are entirely covered with the water-repellent pattern 11 at the point in time when the semiconductor layer 13 is patterned, feeding of the semiconductor material serving as the pattern-forming material may be conducted through application to all over the surface above the substrate 1.

In this manner, the bottom gate type thin film transistor Tr is obtained, in which the gate electrode 3 is covered with the gate insulating film 5, the end portions of the source electrode 7s and the drain electrode 7d disposed on the gate insulating film 5 are disposed above the gate electrode 3 while being opposed to each other, and the semiconductor layer 13 is disposed between the source electrode 7s and the drain electrode 7d.

Figure 3:
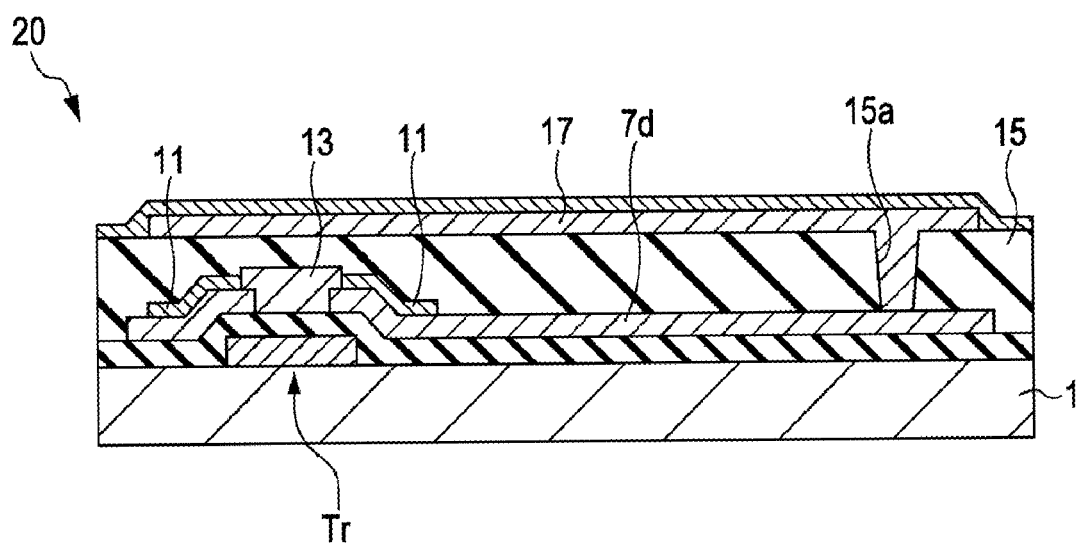
FIG. 3 is a sectional view for explaining production of a backplane of a display according to an embodiment of the present invention.

As shown in FIG. 3, an interlayer insulating film 15 is formed through printing on the substrate 1 provided with the thin film transistor Tr (refer to FIG. 1). Here, the interlayer insulating film 15 provided with a connection hole 15a is formed by, for example, a screen printing method. As for a resin paste used in printing, a polyamide resin, an epoxy resin, a polyester resin, a phenol resin, an urethane resin, an acrylic resin, and the like may be used. However, regarding the thin film transistor Tr having the bottom gate structure produced here, since the interlayer insulating film 15 is formed directly on the semiconductor layer 13, a material having transistor characteristics which do not deteriorate under the influences of a solvent contained in the resin paste and a heat treatment of the resin paste is selected and used.

The connection hole 15a formed in the interlayer insulating film 15 is located in such a way as to reach the drain electrode 7d, for example. In the case where the water-repellent pattern 11 remains above the substrate 1, it is preferable that the connection hole 15a is disposed at a location avoiding the water-repellent pattern 11. The water-repellent pattern 11 may be removed from above the substrate 1 after the semiconductor layer 13 is formed and before the interlayer insulating film 15 is formed.

Then, a pixel electrode 17 connected to the drain electrode 17d through the connection hole 15a is patterned in each pixel region on the interlayer insulating film 15. At this time, the pixel electrode 17 is formed by a screen printing method by using, for example, an electrically conductive silver paste. As for the electrically conductive silver paste, XA-9024 (trade name, produced by Fujikura Kasei Co., Ltd.) is used, and after printing, a heat treatment is conducted at 150° C. so as to obtain the pixel electrode 17. As for the electrically conductive paste used for forming the pixel electrode 17, gold paste, platinum paste, copper paste, nickel paste, palladium paste, alloy materials thereof, and electrically conductive organic materials including poly(3,4-ethylenedioxythiophene)/poly (4-styrenesulfonate) (PEDOT/PSS) and polyaniline (PAN), may be used besides the silver paste. Furthermore, the pixel electrode 17 may be formed through direct patterning by an ink-jet method, a microcontact printing method, or an offset printing method besides the screen printing.

Subsequently, an orientation film 19 in the shape covering the pixel electrode 17 is formed and, thereby, a backplane (semiconductor apparatus) 21 of a liquid crystal display is obtained. This backplane 21 is serves as a drive substrate of an active matrix type liquid crystal display.

Method for Manufacturing Display

Figure 4:
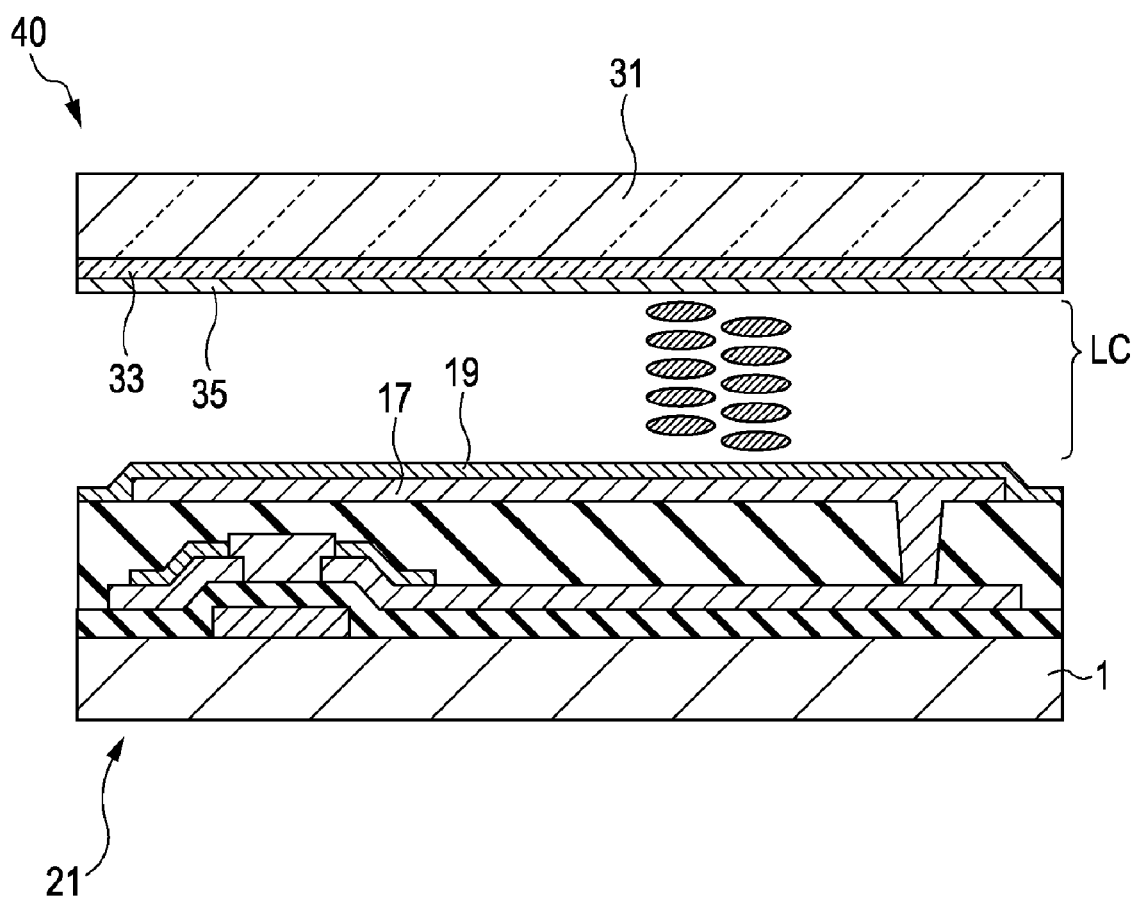
FIG. 4 is a sectional view for explaining production of a liquid crystal display according to an embodiment of the present invention.

A method for manufacturing a liquid crystal display including the resulting backplane 21 will be described below with reference to a sectional view shown in FIG. 4.

A counter substrate 31 is disposed on the side of the surface provided with the orientation film 19 of the backplane 21. This counter substrate 31 is formed from a light-transmitting material. A light-transmitting common electrode 33 formed from a transparent electrically conductive material common to all pixels is disposed on a surface facing the orientation film 19. An orientation film 35 is disposed in such a way as to cover the common electrode 33. A liquid crystal layer LC is filled between the orientation films 19 and 35 of the two substrates 1 and 31 together with spacers (not shown in the drawing) and sealing is conducted. The liquid crystal layer LC to fill in may be a polymer dispersion type liquid crystal layer.

Deflection plates, although not shown in the drawing, are disposed on the outside of the substrate 1 and the outside of the counter substrate 31, so that a liquid crystal display 40 is completed.

According to the above-described manufacturing method, as is described with reference to FIG. 2C, the water-repellent pattern 11 is formed by feeding the fluorine based material while the resin pattern 9 serves as a barrier. Consequently, the water-repellent pattern 11 with good accuracy of shape can be formed even by the printing or coating process while the spreading of the fluorine based material is prevented. That is, usually, the fluorine based material has a small surface energy and, therefore, is wet and spread easily on the substrate 1. Hence, it is difficult to form the water-repellent pattern 11 composed of the fluorine based material directly by the screen printing method or the ink-jet method while the accuracy of shape is ensured. However, in the case where the water-repellent pattern 11 is formed from the fluorine based material while the resin pattern 9 serves as a barrier, as in the above-described embodiment, the water-repellent pattern 11 with good accuracy of shape can be formed from the fluorine based material.

Therefore, regarding the step described with reference to FIG. 2E, a semiconductor layer (desired pattern) can be formed with good accuracy of shape at a high throughput by feeding the semiconductor material (pattern-forming material), that is, by conducting the printing or coating process while the water-repellent pattern 11 serves as a barrier. As a result, miniaturization of the semiconductor apparatus, an improvement of productivity, and a rise in level of definition of a display including the above-described semiconductor apparatus can be facilitated.

Figure 5A:
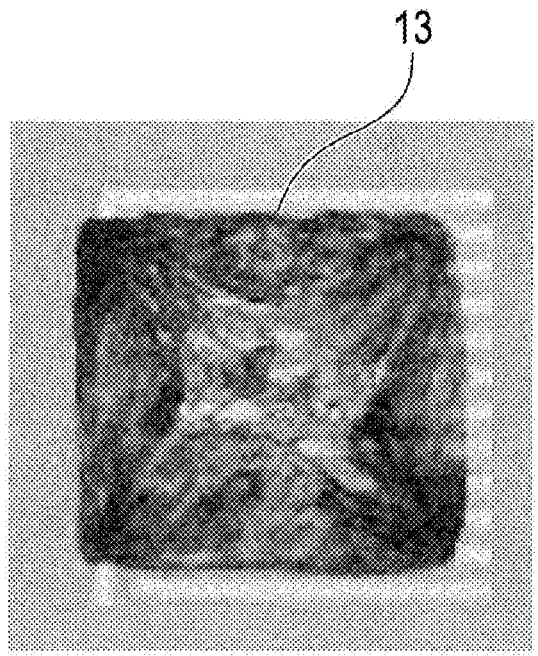
FIG. 5A is a plan view of a semiconductor layer formed as a desired pattern, according to an embodiment of the present invention.

FIG. 5A shows a micrograph of a semiconductor layer 13 patterned following the procedure in the above-described embodiment. In an example shown here, the semiconductor layer 13 is formed on the comb-shaped source/drain electrode 7s/7d. As is shown here, it is ascertained that the semiconductor layer 13 with good accuracy of shape is patterned on the source/drain electrode 7s/7d.

Figure 5B:
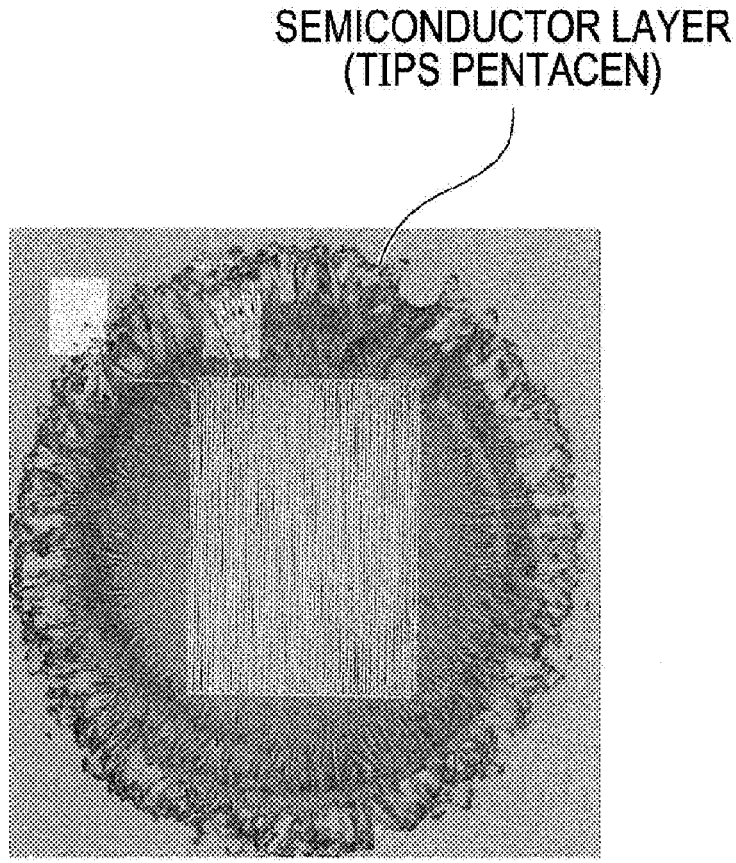
FIG. 5B is a plan view of a semiconductor layer formed through printing without using a water-repellent pattern.

On the other hand, FIG. 5B shows a micrograph in the case where a semiconductor layer is formed through printing without forming a water-repellent pattern. As is shown here, the semiconductor layer formed through printing without forming a water-repellent pattern spreads into the shape of a circle on a feeding portion and, thereby, it is difficult to ensure the accuracy of shape. From these comparisons, it is ascertained that the configuration of the present embodiment has the effect of improving the accuracy of shape of the semiconductor layer formed through printing.

Up to this point, the embodiment in which the present invention is applied to the manufacturing process of the liquid crystal display has been described. However, the present invention is not limited to the application to the production of the liquid crystal display, but can be widely applied to the production of semiconductor apparatuses and displays including the step of patterning a semiconductor layer so as to exert similar effects. Therefore, the present invention may be applied to, for example, production of electrophoresis type displays and production of organic EL displays including organic electroluminescent elements so as to exert similar effects. As for the application to the production of the electrophoresis type display, a microcapsule in which charged graphite fine particles and titanium oxide fine particles are dispersed in silicone ions may be held between the electrodes 17 and 33 without forming orientation films on the two substrates 1 and 31. Furthermore, as for the application to the production of the organic EL display, organic layers including an organic electroluminescent layer may be formed on the pixel electrode 17 through lamination, and a common electrode may be formed thereon. The circuit configuration of the pixel circuit including the thin film transistor Tr and the capacity element C may be changed in such a way as to become suitable for driving the display.

The pattern formed as the desired pattern is not limited to the semiconductor layer. For example, it is possible to apply to formation of a color filter as the desired pattern, and the color filter with good accuracy of shape may be formed by a printing or coating method. Moreover, it is also possible to apply to formation of an organic layer of light-emitting portion of an organic EL display through coating.

The present application contains subject matter related to that disclosed in Japanese Priority Patent Application JP 2008-126820 filed in the Japan Patent Office on May 14, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor apparatus comprising the steps of:
   printing a resin pattern on a substrate having a source electrode and a drain electrode of a thin film transistor formed thereon, the resin pattern covering a portion between the source electrode and the drain electrode and having an opening surrounding the portion between the source electrode and the drain electrode;
   depositing a fluorine based material into the opening of the resin pattern that surrounds the portion between the source electrode and the drain electrode and forming a water-repellent pattern in such a way that a bottom of the opening of the resin pattern is covered with the fluorine based material;
   forming an open window in the water-repellent pattern by removing the resin pattern; and
   forming a pattern of a semiconductor layer composed of a semiconductor material between the source electrode and the drain electrode by depositing the semiconductor material into the open window of the water-repellent pattern.

2. The method for forming a semiconductor apparatus according to claim 1, wherein:
   the opening in the resin pattern surrounding the portion between the source electrode and the drain electrode is ring-shaped,
   the water-repellent pattern having the open window is ring-shaped, and
   the pattern of semiconductor layer is island-shaped.

3. The method for manufacturing a semiconductor apparatus according to claim 1 or claim 2, wherein the fluorine based material is deposited by means of coating or printing.

4. The method for manufacturing a semiconductor apparatus according to claim 1 or 2, wherein the semiconductor material is deposited into the open window of the water-repellent pattern by means of coating.

5. The method for manufacturing a semiconductor apparatus according to claim 1 or 2, wherein the resin pattern is screen printed.

6. A method for manufacturing a display comprising the steps of:
   forming a source electrode and a drain electrode of a thin film transistor on a substrate;
   printing a resin pattern on the substrate, the resin pattern covering a portion between the source electrode and the drain electrode and having an opening surrounding the portion between the source electrode and the drain electrode;
   depositing a fluorine based material into the opening of the resin pattern that surrounds the portion between the source electrode and the drain electrode and forming a water-repellent pattern in such a way that a bottom of the opening of the resin pattern is covered with the fluorine based material;
   forming an open window in the water-repellent pattern by removing the resin pattern;
   forming a pattern of a semiconductor layer composed of a semiconductor material between the source electrode and the drain electrode by depositing the semiconductor material into the open window of the water-repellent pattern;
   forming an insulating film having a connection hole above the substrate provided with the semiconductor layer; and
   forming a pixel electrode connected to one of the source electrode and the drain electrode through the connection hole, on the insulating film.

7. The method for manufacturing a display according to claim 6, wherein:
   the opening in the resin pattern is ring-shaped,
   the water-repellent pattern having the open window is ring-shaped, and
   the pattern of semiconductor layer is island-shaped, and
   the insulating film is formed in such a way that the connection hole is disposed at a position outside of the water-repellent pattern.

* * * * *